United States Patent
Nguyen et al.

(10) Patent No.: US 11,973,500 B2
(45) Date of Patent: Apr. 30, 2024

(54) CONFIGURATION BIT USING RRAM

(71) Applicant: Crossbar, Inc., Santa Clara, CA (US)

(72) Inventors: Sang Nguyen, Union City, CA (US); Cung Vu, San Jose, CA (US); Hagop Nazarian, San Jose, CA (US)

(73) Assignee: CROSSBAR, INC>, Santa Clara, CA (US)

( * ) Notice: Subject to any disclaimer, the term of this patent is extended or adjusted under 35 U.S.C. 154(b) by 149 days.

(21) Appl. No.: 17/696,473

(22) Filed: Mar. 16, 2022

(65) Prior Publication Data

US 2023/0299772 A1    Sep. 21, 2023

(51) Int. Cl.
| | |
|---|---|
| H03K 19/177 | (2020.01) |
| G11C 13/00 | (2006.01) |
| H03K 19/17736 | (2020.01) |
| H03K 19/17758 | (2020.01) |
| H03K 19/1776 | (2020.01) |

(52) U.S. Cl.
CPC ..... *H03K 19/1776* (2013.01); *G11C 13/0002* (2013.01); *G11C 13/0069* (2013.01); *G11C 13/0097* (2013.01); *H03K 19/17744* (2013.01); *H03K 19/17758* (2020.01)

(58) Field of Classification Search
CPC ............ G11C 13/0002; G11C 2213/15; G11C 2213/74; G11C 14/009; G11C 11/56; G11C 2013/009; G11C 2013/0078; G11C 13/0069; G11C 13/0097; H03K 19/1776; H03K 19/0013; H03K 19/17758; H03K 19/17744
See application file for complete search history.

(56) References Cited

U.S. PATENT DOCUMENTS

| | | | | |
|---|---|---|---|---|
| 9,001,552 B1* | 4/2015 | Nguyen | ............ | G11C 13/0002 |
| | | | | 365/189.16 |
| 9,202,543 B2* | 12/2015 | Boujamaa | ............ | G11C 13/004 |
| 9,355,717 B1* | 5/2016 | Nazarian | ............ | G11C 13/004 |
| 9,558,819 B1* | 1/2017 | Aitken | ................ | G11C 13/004 |
| 9,620,206 B2* | 4/2017 | Nazarian | ............ | H10N 70/826 |
| 9,627,057 B2* | 4/2017 | Nazarian | ............ | G11C 13/0028 |
| 9,792,982 B1* | 10/2017 | Sandhu | ............ | G11C 13/0069 |
| 9,953,727 B1* | 4/2018 | Fifield | .................... | G11C 17/16 |
| 10,056,907 B1* | 8/2018 | Asnaashari | ........ | H03K 19/1776 |
| 10,255,987 B1* | 4/2019 | Fifield | .................... | G11C 29/50 |

* cited by examiner

*Primary Examiner* — Vibol Tan
(74) *Attorney, Agent, or Firm* — Wegman Hessler Valore

(57) ABSTRACT

A field programmable gate array (FPGA) utilizing resistive switching memory technology is described. The FPGA can comprise a switching block interconnect having a set of signal input lines and a set of signal output lines. Respective intersections of the signal input lines and signal output lines can have two resistive switching memory cells, a current differential latch, and a switching transistor (also referred to as a pass gate transistor) arranged in a circuit. Resistance states of the resistive switching memory cells can be programmed to control an output voltage state of the current differential latch. The output voltage state is latched into the current differential latch which can drive a gate of the switching transistor to activate or deactivate the switching transistor, which in turn activates or deactivates an intersection of the FPGA.

10 Claims, 9 Drawing Sheets

CONFIGURATION BIT USING RRAM

BACKGROUND

The present disclosure relates to devices including field programmable gate arrays. A field programmable gate array (FPGA) is an integrated circuit that can be configured after manufacturing. It is a flexible device having a great number of potential configuration modes to interact with various other hardware and software designs (e.g., on a computer motherboard). The FPGA configuration is generally specified using a hardware description language, similar to that used for an application specific integrated circuit (ASIC). Generally speaking, an FPGA can be configured to implement most or all logic functions that an ASIC could execute, yet also can be at least partially reconfigured after shipping. Coupled with relatively low design costs typically associated with ASIC design, FPGAs offer significant advantages for a wide array of electronic devices and applications.

The FPGA architecture generally comprises a set of programmable logic components, or logic blocks, and reconfigurable interconnects for selectively connecting a subset of the logic blocks with other subsets thereof. Logic blocks can be configured to execute complex algorithms, or simple logic functions like AND, NAND, NOR, etc. Most FPGAs also include memory elements that can include flip-flops, memory registers, memory arrays, or the like.

Like most integrated circuits, design goals for the FPGA include reducing minimum component size, increasing calculation speed, lowering power consumption, and others. As more applications are found for these devices, demand for improved technology comes from many sectors. Although FPGAs were largely used exclusively in telecommunications and networking in early implementations, their versatility has found these devices implemented in other industries, consumer, automotive and industrial applications.

One recent development of the general FPGA architecture was to combine embedded microprocessors with the traditional logic blocks and interconnects of the FPGA. This development has lead to what are referred to as system-on-chip or system on programmable chip devices. Many examples of system-on-chip devices have emerged, generally combining processor and analog peripheral components with the FPGA architecture. The system-on-chip has enabled the miniaturization of microprocessors to achieve a new paradigm. However, as is typical with electronics technology, new paradigms very rapidly lead to applications requiring smaller, faster or lower power devices, generating new demand for research and development.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Various aspects of the subject disclosure provide a field programmable gate array (FPGA) utilizing resistive switching memory technology. The FPGA can comprise a switching block interconnect having a set of signal input lines and a set of signal output lines. The FPGA can further comprise configuration cells formed at respective intersections of the signal input lines and signal output lines. A configuration cell can comprise two resistive switching memory cells, a current differential latch, and a switching transistor (also referred to as a pass gate transistor). The respective resistance states of the resistive switching memory cells can be programmed to set an output voltage state of the current differential latch. The output voltage state is latched into the current differential latch which can drive a gate of the switching transistor to conduct or not conduct according to the output voltage state. The switching transistor is therefore configured to activate or deactivate the intersection.

According to one aspect of the invention, a field programmable gate array (FPGA) is disclosed. One apparatus includes a switching block routing array comprising a plurality of signal inputs and a plurality of signal outputs, and a first transistor element coupled to the switching block routing array, wherein the first transistor element comprises a gate, a first terminal and a second terminal, wherein the first terminal of the first transistor element is coupled to a signal input from the plurality of signal inputs, and wherein the second terminal of the first transistor element is coupled to a signal output from the plurality of signal outputs, and wherein the gate of the first transistor element is configured to electrically couple or decouple the signal input and the signal output in response to an output signal from an output of a latch (106); a first programmable resistive element (124) that comprises a first terminal and a second terminal; a second programmable resistive element (128) that comprises a first terminal and a second terminal, wherein the second terminals of the first and second programmable resistive elements are coupled to each other and a source line of the FPGA; a second transistor element (122) that comprises a gate, a first terminal and a second terminal; a third transistor element (128) that comprises a gate, a first terminal and a second terminal; the latch comprising, a source input, a load input (108), a fourth transistor element (106A), a fifth transistor element (106B), a sixth transistor element (106D), a seventh transistor element (106E), an eighth transistor element (106C), a ninth transistor element (106F), a tenth transistor element (106 G), and an eleventh transistor element (106H), and an output (130), wherein the output is coupled to the first gate of the first transistor element, and the fourth transistor element, the fifth transistor element, the sixth transistor element, the seventh transistor element, the eighth transistor element, the ninth transistor element, the tenth transistor element, and the eleventh transistor element each have a gate, a first terminal and a second terminal; wherein the gate of the second transistor element is coupled to a first select line (110), the second terminal of the second transistor element is coupled to a first data line (114), and the first terminal of the second transistor element is coupled to the first terminal of the first programmable resistive element and the second terminal of the tenth transistor element; wherein the gate of the third transistor element is coupled to a second select line (112), the second terminal of the third transistor element is coupled to a second data line (116), and the first terminal of the third transistor element is coupled to the first terminal of the second programmable resistive element and the second terminal of the eleventh transistor element. The programmable resistive elements are characterized by a plurality of resistive states including a low resistive state and a high resistive state, wherein each programmable resistive element is characterized by a polarity, wherein the polarity for each programmable resistive element is characterized by a low resistive state in response to a first voltage applied from the first terminal to the second terminal exceeding an program voltage and is characterized by a high resistive state in response to a second voltage applied from the second terminal to the first terminal exceeding an erase voltage.

Also disclosed is a configuration bit for a FPGA. The configuration bit can comprise a first transistor element coupled to a signal input and a signal output of the FPGA, and configured to electrically connect the signal input with the signal output or electrically isolate the signal input from the signal output in response to a gate voltage applied at a gate of the first transistor element. Further, the configuration bit can comprise a latch having an output node that provides the gate voltage to the gate of the first transistor element and having a differential node. In an embodiment(s), the latch is configured such that a high voltage supplied to the differential node causes the output node to have a low voltage and the differential node to have the high voltage, and wherein the high voltage supplied to the output node causes the differential node to have the low voltage and the output node to have the high voltage. Further to the above, the configuration bit can comprise a first programmable resistive element having a first terminal selectively connected to the differential node of the latch and a second programmable resistive element having a second terminal selectively connected to the output node of the latch. Moreover, the configuration bit can comprise a source line connected to a second terminal of the first programmable resistive element and to a second terminal of the second programmable resistive element. In various disclosed embodiments, in response to a high voltage at the source line and the first programmable resistive element being selectively connected to the differential node of the latch and the second programmable resistive element being selectively connected to the output node of the latch, the high voltage can be supplied by the first programmable resistive element to the differential node of the latch in response to the first programmable resistive element having a low resistance state, or the high voltage can be supplied by the second programmable resistive element to the output node of the latch in response to the second programmable resistive element having the low resistance state.

The following description and the annexed drawings set forth in detail certain illustrative aspects of the disclosed subject matter. These aspects are indicative, however, of but a few of the various ways in which the principles of the innovation can be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
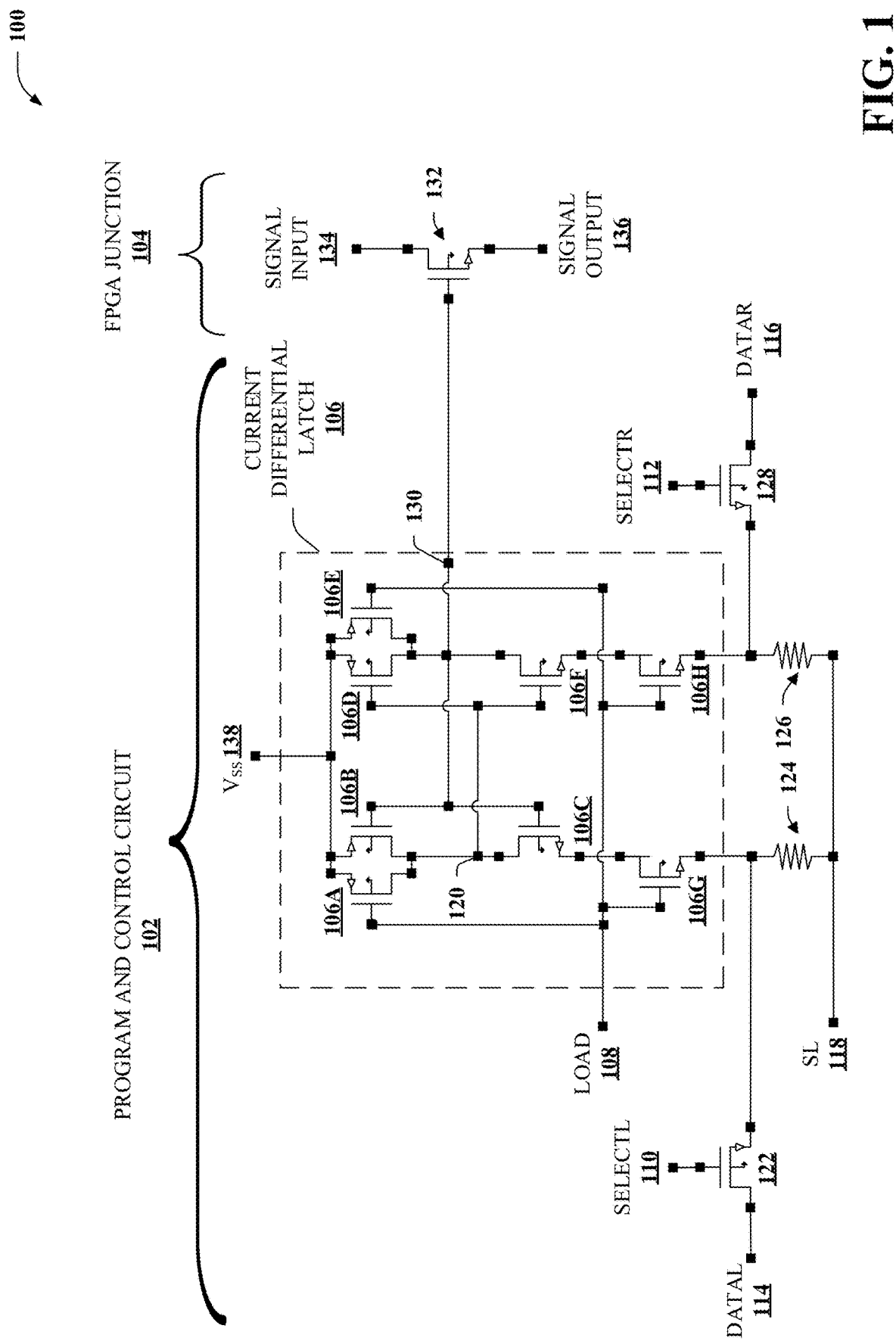
FIG. 1 illustrates a schematic diagram of a non-limiting example resistive switching memory configuration cell according to one or more aspects of the subject disclosure.

The disclosed subject matter is described with reference to the drawings, wherein like reference numerals are used to refer to like elements throughout the description. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram or schematic form in order to facilitate describing the subject innovation.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the claimed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the claimed subject matter.

Field programmable gate arrays (FPGAs) are employed in a wide range of electronic technology, serving as reconfigurable systems. In some applications, FPGAs can be integrated with microprocessors to serve as system-on-chip devices, which can be employed as a primary controller for various computer components, such as set top boxes and others. A wide range of uses for these devices exist, including telecommunications and networking, robotics, microelectronics, small-scale industrial manufacturing, consumer electronics including handset computers, smart-phones and personal digital assistants, and the like, as well as other applications and technologies. Additionally, new applications are invented routinely as capabilities of FPGA and FPGA-based devices improve.

One basic FPGA architecture is the programmable switching block, which acts as a programmable signal routing matrix. A switching block comprises a set of parallel signal input lines intersected by a set of perpendicular signal output lines. At a junction of respective signal input lines and signal output lines is a configuration cell (also referred to herein as a configuration bit). Activation and deactivation of subsets of configuration cells at respective signal input/signal output junctions facilitate configuration of a programmable switching block. Particularly, a configuration cell at a given junction can be activated to electrically connect or route a signal input line to a signal output line at that junction, or can be deactivated to electrically isolate the signal input line and signal output line at that junction. The ability to activate or deactivate respective junctions is the basis for configurability of the programmable switching block. Thus, for instance, a set of electrical components connected to the signal inputs and signal outputs can be selectively inter-connected by activating particular junctions and deactivating other junctions. This selective inter-connection can enable some functionality, while disabling other functionality, in effect configuring the programmable switching block for the enabled functionality (which is a subset of all possible functionality thereof).

One of the more common FPGA configuration cells is the SRAM configuration cell. Probably the most typical SRAM configuration cell comprises six or more transistors, referred to as a 6T SRAM cell. Four of the SRAM transistors form a pair of cross-coupled inverters, or latches. The SRAM cell has two stable states that denote respective states of a binary bit, 0 and 1. The remaining two transistors of the 6T SRAM cell control access to a storage cell during read and write operations, and are referred to as access transistors.

In addition to the basic 6T SRAM, other SRAM chips use eight transistors, ten transistors or more to store a single bit. Generally, the fewer transistors needed per cell the smaller the cell and the lower the cost of manufacture. The relatively large area of the 6T SRAM cell (often greater than $125F^2$—where F denotes the minimum feature size, such as 65 nanometer, etc.) increases cost of manufacture while reducing transistor density, as compared with technologies having smaller component size. In addition, SRAM is volatile memory, requiring continuous power to maintain stored information, and is susceptible to memory loss from high frequency electromagnetic radiation (e.g., cosmic rays, high frequency ultraviolet, X-Ray, etc.). Moreover, a system designed with SRAM based FPGA typically requires external Flash memory to configure the SRAM bits during power up sequence, slowing down the power up sequence, and further adding to manufacture costs and increasing chip size.

A recent innovation for integrated circuit technology has been the concept of a resistive random access memory (RRAM). In theory, RRAM is a non-volatile memory technology that induces a filament (or many filaments) in a dielectric material. In a normal state, the dielectric has high resistance, and is non-conductive. However, application of a suitable voltage across the dielectric can induce a conduction path therein. Various physical mechanisms enable generation of a conduction path in a dielectric, including defects in the material (whether natural or induced via doping), metal migration, and so on. Once the filament is formed within the dielectric, it can be activated—resulting in a low resistance conduction path through the dielectric—or deactivated—rendering the dielectric a high resistance electrical insulator—through application of a suitable program voltage. Thus, the conduction path can be referred to as a programmable conduction path, yielding similar electric characteristics as a conventional three-terminal transistor. In practice, however, the inventors of the present disclosure believe that conceptual models for RRAM have not been commercially successful in the past for reasons including incompatibility of RRAM fabrication materials with traditional CMOS processes, the incompatibility of RRAM processes as part of back end CMOS fabrication, and the like.

The inventors believe that a basic memory cell architecture employing the RRAM technology could be a configuration of bitlines intersected by overlying (or underlying) wordlines. A programmable resistance dielectric can be formed at the junction of each bitline and wordline. Such a basic memory cell would be referred to as a cross-point cell. One application of the RRAM cross-point cell, for instance, would be a block of reconfigurable interconnects within a FPGA. The RRAM cross-point cell can provide non-volatile RRAM memory cells to store information for configuration bits of the FPGA. The non-volatile cells would mitigate data loss in the event of power failure, provide radiation immunity, facilitate quicker power-up, as well as other benefits. In some embodiments, the non-volatile RRAM memory cells can comprise integral selector devices to improve a ratio of activated and deactivated resistance states to $10^6$ or greater, for sensitive application as one example. As an illustrative example, the selector device can be a FAST™ selector device under development by the current assignee of the present application for patent (e.g., see U.S. patent application Ser. No. 14/588,185 commonly assigned to the assignee of the present application for patent and hereby incorporated by reference herein in its entirety and for all purposes), although other selector devices (e.g., an Ovonic switch, a metal-insulator-transition (MIT) device, a MOTT insulator, etc.) can be employed consistent with one or more embodiments as well.

Aspects of the subject disclosure provide alternatives to configuration cells comprised exclusively of SRAM memory or other volatile switches, in various embodiments. In one aspect, a programmable switching block is formed from resistive random access memory (RRAM) in conjunction with a latch. It should be appreciated that other two-terminal, non-volatile resistive switching memory technologies can be employed in addition to RRAM. Thus, although RRAM is included, resistive-switching memory is used throughout to refer to two-terminal, non-volatile resistive switching memory technology in general. RRAM, being non-volatile memory, provides the capacity to store data without continuous application of power. Therefore, FPGAs utilizing non-volatile embedded RRAM as configuration bits can have a much faster power up cycle than configuration bits exclusively comprising SRAM or other volatile switches, since additional non-volatile memory external to the FPGA is generally not required to prevent data loss. In addition to the foregoing, RRAM cells can generally be built between metal interconnect layers, enabling RRAM FPGAs to be usable for two-dimension as well as three-dimension FPGA architectures.

According to further aspects, the RRAM-based configuration cell comprises programming circuitry that is independent of signal input and signal output lines of an associated FPGA programmable switching block. The independent programming circuitry can improve input signal to output signal propagation performance since the programming circuits are not generating additional load capacitance and leakage on the input signal and output signal lines.

Referring now to the drawings, FIG. 1 illustrates a non-limiting example schematic diagram of an example resistive switching memory configuration cell 100 according to various aspects of the subject disclosure. resistive switching memory configuration cell 100 can be employed as a component of various electronic systems and architectures, including a FPGA device. In at least one aspect of the subject disclosure, resistive switching memory configuration cell 100 can be employed for a programmable switching block, for instance, involved with activating or deactivating signal input and output junctions thereof.

Resistive switching memory configuration cell 100 can comprise program and control circuit 102 and FPGA junction 104. FPGA junction 104 can comprise transistor element 132. Program and control circuit 102 can comprise left programmable resistive element 124 (e.g. LEFT resistive switching memory), and right programmable resistive element 126 (e.g. RIGHT resistive switching memory), current differential latch 106, and transistor elements 122 and 128. Current differential latch 106 can comprise LOAD 108 input, output 130, and transistor elements 106A, 106B, 106C, 106D, 106E, 106F, 106G, and 106H.

Transistor elements 106A, 106B, 106C, 106D, 106E, 106F, 106G, 106H, 122, 128, and/or 132 can comprise a gate-driven transistor having relatively high cutoff ratio. Further, transistor elements 106A, 106B, 106C, 106D, 106E, 106F, 106G, 106H, 122, 128, and/or 132 can have at least a gate and a channel region with a first terminal and a second terminal. Examples of transistor elements 106A, 106B, 106C, 106D, 106E, 106F, 106G, 106H, 122, 128, and/or 132 can include an NMOS transistor, a PMOS transistor, or a CMOS transistor (e.g., an NMOS+PMOS transistor), or other suitable three-terminal transistor. In at least one aspect of the subject disclosure, transistor elements 106A, 106B, 106C, 106D, 106E, 106F, 106G, 106H, 122, 128, and/or 132 can be selected for suitable electrical characteristics, including switching speed, power consumption, cutoff ratio (e.g., about $10^6$, about $10^7$, or greater), or the like, or a suitable combination thereof. The electrical characteristics can be matched to an anticipated application or group of applications in which resistive switching memory configuration cell 100 is intended for use.

A first terminal (e.g., source, drain) of transistor element 132 is coupled to signal input 134 (e.g., of an input/output junction of an FPGA) and a second terminal of transistor element 136 (e.g., drain, source) is coupled to signal output 136 (e.g., of the input/output junction of the FPGA). The gate of transistor element 132 can be driven by a signal from output 130. Output 130 therefore controls activation/deactivation states of transistor element 132.

As depicted in FIG. 1, in a non-limiting example, current differential latch 106 can comprise eight transistor elements 106A, 106B, 106C, 106D, 106E, 106F, 106G, and 106H. In a non-limiting example, transistor elements 106A, 106B, 106C, 106D, 106E, and 106F can be PMOS transistors, and transistor elements 106G, and 106H can be NMOS transistors. The gates of transistor elements 106A, 106E, 106G, and 106H are coupled to LOAD 108 input. A first terminal of a channel region of transistor element 106A, a first terminal of a channel region of transistor element 106B, a first terminal of a channel region of transistor element 106D, and first terminal of a channel region of transistor element 106E are coupled to each other and a Vss 138 voltage connection. In a non-limiting example, Vss 138 voltage can be a low voltage (e.g., less than or equal to one volt). A second terminal of a channel region of transistor element 106A, a second terminal of a channel region of transistor element 106B, a first terminal of a channel region of transistor element 106C, and gates of transistor elements 106D and 106F are coupled to each other (e.g., at node 120). A second terminal of a channel region of transistor element 106D, a second terminal of a channel region of transistor element 106F, a first terminal of a channel region of transistor element 106E, and gates of transistor elements 106B and 106C are coupled to each other and output 130. A first terminal of a channel region of transistor element 106G and a second terminal of a channel region of transistor element 106C are coupled to each other. A first terminal of a channel region of transistor element 106H and a second terminal of a channel region of transistor element 106F are coupled to each other. A second terminal of a channel region of transistor element 106G, a first terminal of a channel region of transistor element 122, and a first terminal of left programmable resistive element 124 are coupled to each other. A second terminal of a channel region of transistor element 106H, a first terminal of a channel region of transistor element 128, and a first terminal of right programmable resistive element 126 are coupled to each other.

Second terminals of left programmable resistive element 124 and right programmable resistive element 126 are coupled to each other and to SL 118 line (e.g. source line). A second terminal of a channel region of transistor element 122 is coupled to a DATAL 114 line. A second terminal of a channel region of transistor element 128 is coupled to a DATAR 116 line. A gate of transistor element 122 is coupled to a SELECTL 110 line. A gate of transistor element 128 is coupled to a SELECTR 112 line.

The gate of transistor element 122 can be driven by a signal on SELECTL 110 line. SELECTL 110 line therefore controls activation/deactivation states of transistor element 122. The gate of transistor element 128 can be driven by a signal on SELECTR 112 line. SELECTR 112 line therefore controls activation/deactivation states of transistor element 128.

Programmable resistive elements 124 and 126 can have programmable resistances. For instance, programmable resistive elements 124 and 126 can have at least a first programmable resistance and a second programmable resistance, where the second programmable resistance is a different resistance value from the first programmable resistance. In an aspect of the subject disclosure, programmable resistive elements 124 and 126 can be programmed or erased to have the first or second programmable resistances (e.g., low resistance and high resistance).

Figure 2:
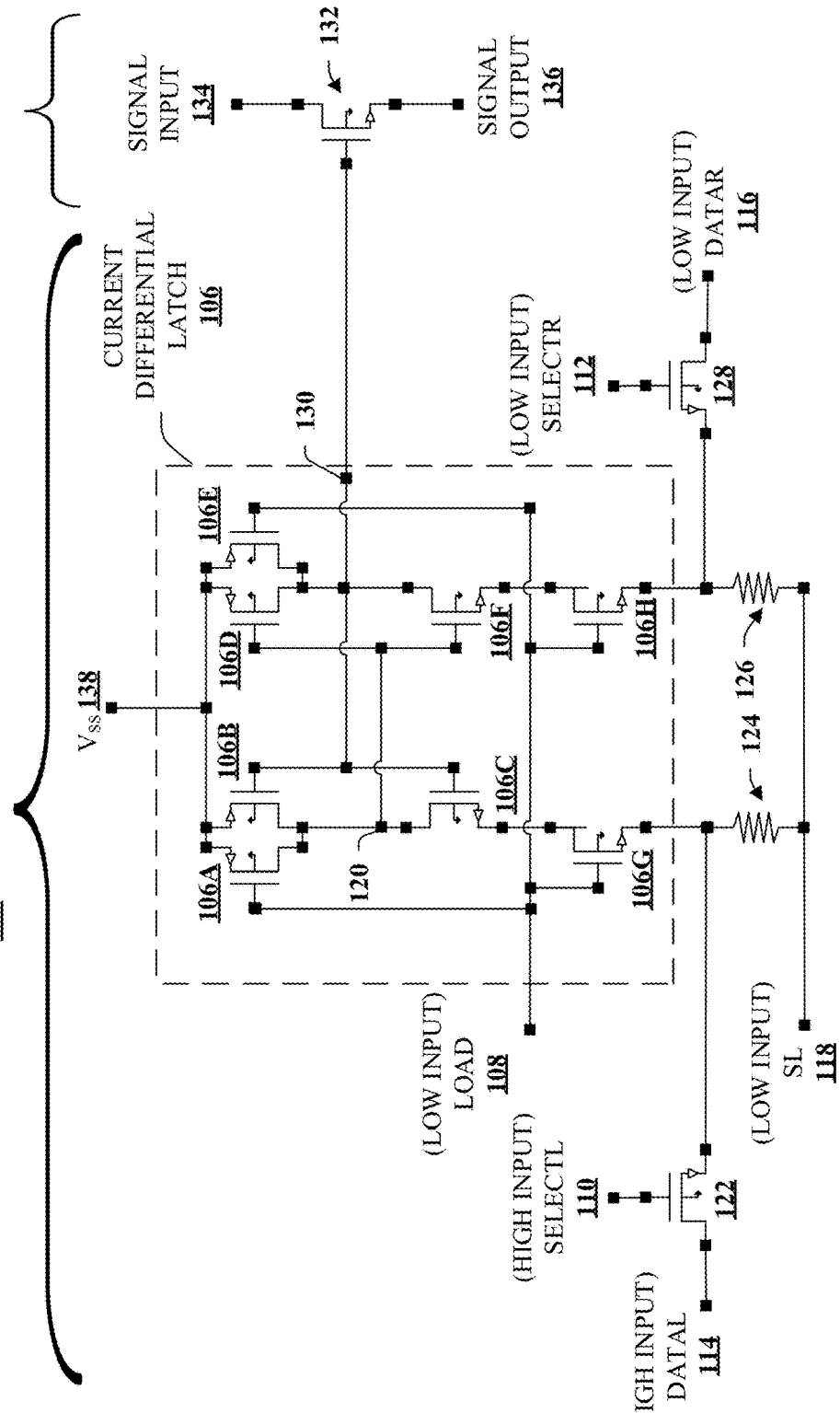
FIG. 2 illustrates a schematic diagram of an example LEFT resistive switching memory program operation according to one or more aspects of the subject disclosure.

FIG. 2 illustrates a schematic diagram of an example LEFT resistive switching memory program operation according to one or more aspects of the subject disclosure. In a non-limiting example, an operational programming of programmable resistive element 124 is as follows. A low voltage input (e.g. low voltage or ground voltage) is applied to LOAD 108 input. This isolates current differential latch 106 from the programmable resistive elements 124 and 126 by deactivating (e.g., opening) transistor elements 106G and 106H. Concurrent to the low voltage input applied to LOAD 108 input, a low voltage input is applied on SELECTR 112 line. This isolates DATAR 116 line from programmable resistive element 126 by deactivating transistor element 128, thus preventing programming of programmable resistive element 126. As depicted in FIG. 2, a low voltage input is applied to DATAR 116 line. However, given that DATAR 116 line is isolated from programmable resistive element 126, DATAR 116 line can have a high voltage applied or float. Concurrent to the low voltage input applied on LOAD 108 and SELECTR 112 lines, a high voltage input (e.g. program voltage) is applied to SELECTL 110 line and DATAL 114 line, and a low voltage input is applied to SL 118 line. In a non-limiting example, program voltage can be 2.5 volts, or any other suitable programming voltage for a programmable resistive element. Application of the high voltage input on SELECTL 110 line couples DATAL 114 line to the second terminal of programmable resistive element 124, by activating (e.g. closing) transistor element 122. The polarity and difference in voltage between DATAL 114 line and SL 118 line meeting a program voltage threshold causes programmable resistive element 124 to be set into a program resistance state (e.g. low resistance).

Figure 3:
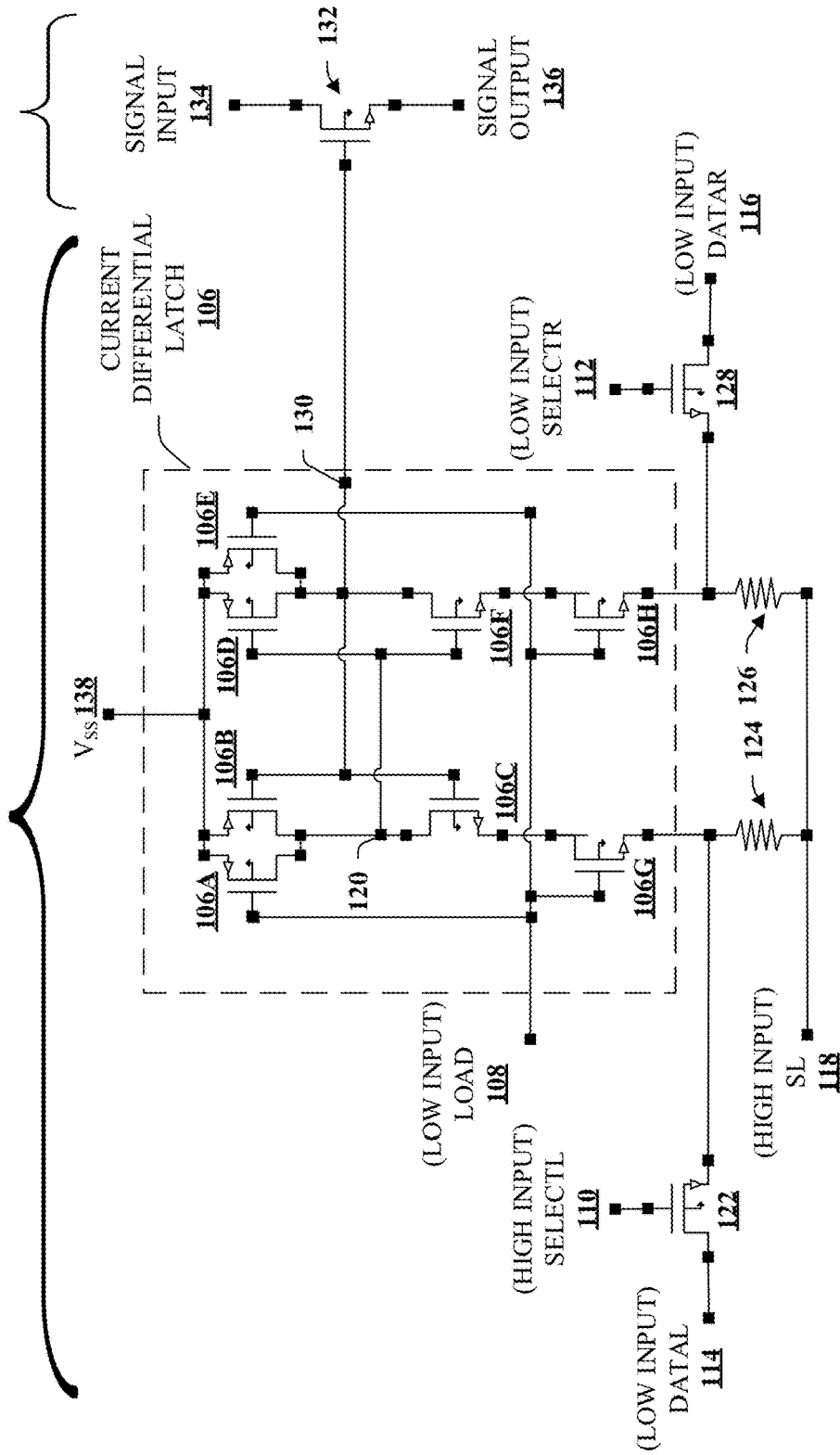
FIG. 3 illustrates a schematic diagram of an example LEFT resistive switching memory erase operation according to one or more aspects of the subject disclosure.

FIG. 3 illustrates a schematic diagram of an example LEFT resistive switching memory erase operation according to one or more aspects of the subject disclosure. In a non-limiting example, an operational erasing of programmable resistive element 124 is as follows. A low voltage input (e.g. low voltage or ground voltage) is applied to LOAD 108 input. This isolates current differential latch 106 from the programmable resistive elements 124 and 126 by deactivating transistor elements 106G and 106H. Concurrent to the low voltage input applied to LOAD 108 input, a low voltage input is applied on SELECTR 112 line. This isolates DATAR 116 line from programmable resistive element 126 by deactivating transistor element 128, thus preventing programming of programmable resistive element 126. As depicted in FIG. 2, a low voltage input is applied to DATAR 116 line. However, given that DATAR 116 line is isolated from programmable resistive element 126, DATAR 116 line can have a high voltage applied or float. Concurrent to the low voltage input applied on LOAD 108 and SELECTR 112 lines, a high voltage input (e.g. program voltage) is applied to SELECTL 110 line and SL 118 line, and a low voltage input is applied to DATAL 114 line. Application of the high voltage input on SELECTL 110 line couples DATAL 114 line to the second terminal of programmable resistive element 124, by activating transistor element 122. The polarity and difference in voltage between DATAL 114 line and SL 118 line meeting an erase voltage threshold causes programmable resistive element 124 to be set into an erase resistance state (e.g. high resistance).

Figure 4:
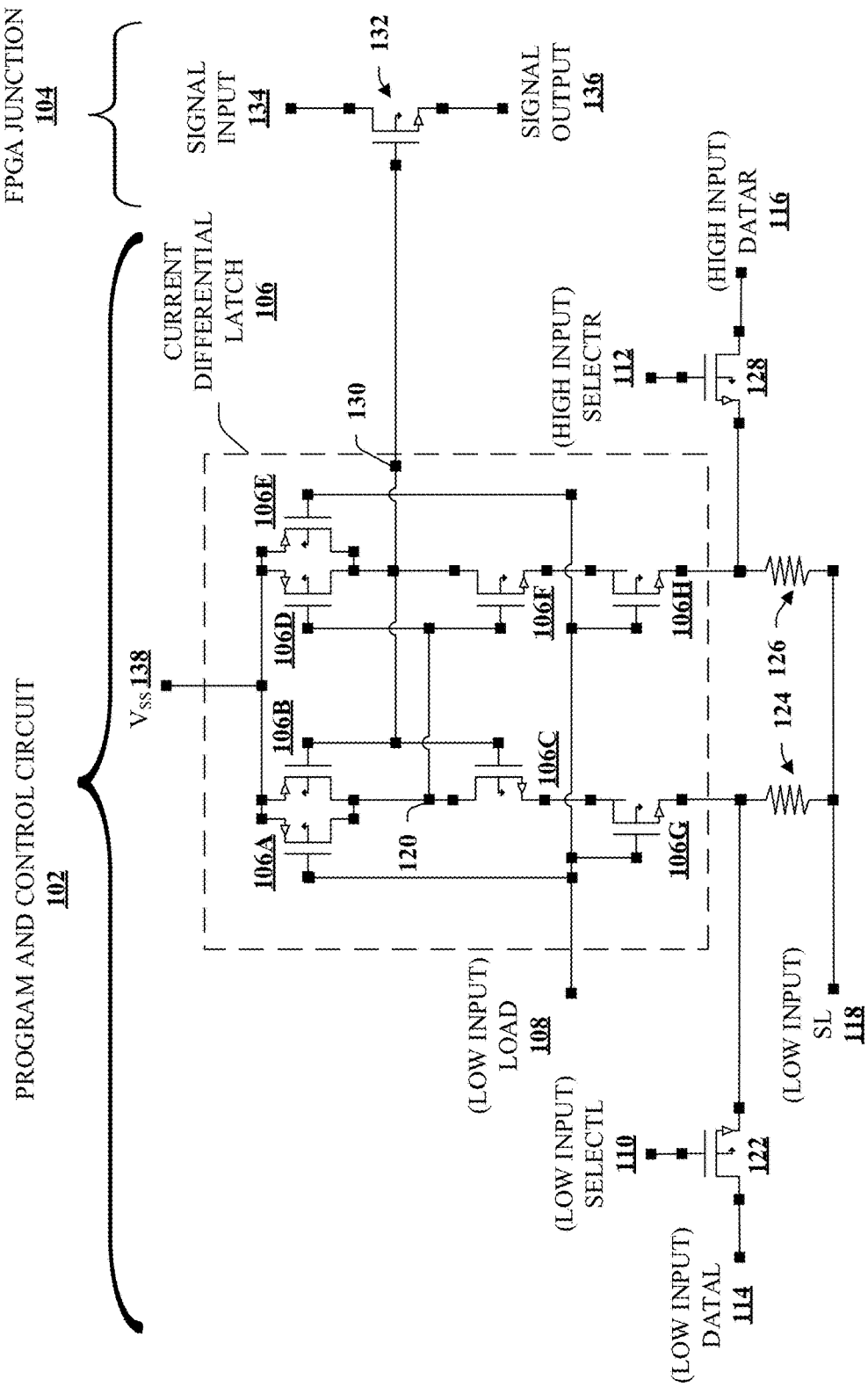
FIG. 4 illustrates a schematic diagram of an example RIGHT resistive switching memory program operation according to one or more aspects of the subject disclosure.

FIG. 4 illustrates a schematic diagram of an example RIGHT resistive switching memory program operation according to one or more aspects of the subject disclosure. In a non-limiting example, an operational programming of programmable resistive element 126 is as follows. A low voltage input (e.g. low voltage or ground voltage) is applied to LOAD 108 input. This isolates current differential latch 106 from the programmable resistive elements 124 and 126 by deactivating transistor elements 106G and 106H. Concurrent to the low voltage input applied to LOAD 108 input, a low voltage input is applied on SELECTL 110 line. This isolates DATAL 114 line from programmable resistive element 124 by deactivating transistor element 122, thus preventing programming of programmable resistive element 124. As depicted in FIG. 4, a low voltage input is applied to DATAL 114 line. However, given that DATAL 114 line is isolated from programmable resistive element 126, DATAL 114 line can have a high voltage applied or float. Concurrent to the low voltage input applied on LOAD 108 and SELECTL 110 lines, a high voltage input is applied to SELECTR 112 line and DATAR 116 line, and a low voltage input is applied to SL 118 line. Application of the high voltage input on SELECTR 112 line couples DATAR 116 line to the second terminal of programmable resistive element 126, by activating transistor element 128. The polarity and difference in voltage between DATAR 116 line and SL 118 line meeting a program voltage threshold causes programmable resistive element 126 to be set into a program resistance state.

Figure 5:
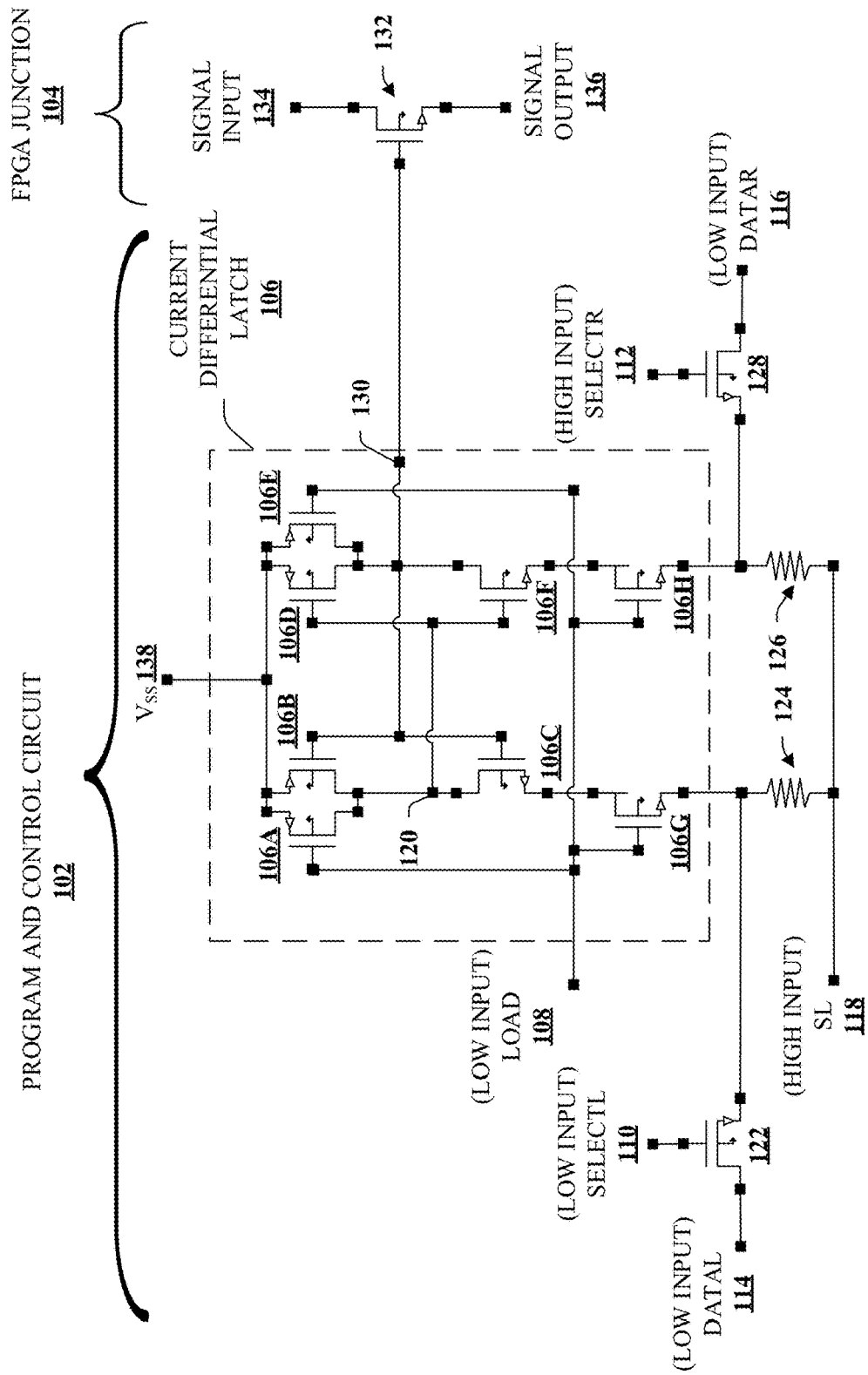
FIG. 5 illustrates a schematic diagram of an example RIGHT resistive switching memory erase operation according to one or more aspects of the subject disclosure.

FIG. 5 illustrates a schematic diagram of an example RIGHT resistive switching memory erase operation according to one or more aspects of the subject disclosure. In a non-limiting example, an operational erasing of programmable resistive element 126 is as follows. A low voltage input (e.g. low voltage or ground voltage) is applied to LOAD 108 input. This isolates current differential latch 106 from the programmable resistive elements 124 and 126 by deactivating transistor elements 106G and 106H. Concurrent to the low voltage input applied to LOAD 108 input, a low voltage input is applied on SELECTL 110 line. This isolates DATAL 114 line from programmable resistive element 124 by deactivating transistor element 122, thus preventing programming of programmable resistive element 124. As depicted in FIG. 4, a low voltage input is applied to DATAL 114 line. However, given that DATAL 114 line is isolated from programmable resistive element 126, DATAL 114 line can have a high voltage applied or float. Concurrent to the low voltage input applied on LOAD 108 and SELECTL 110 lines, a high voltage input is applied to SELECTR 112 line and SL 118 line, and a low voltage input is applied to DATAR 116 line. Application of the high voltage input on SELECTR 112 line couples DATAR 116 line to the second terminal of programmable resistive element 126, by activating transistor element 128. The polarity and difference in voltage between DATAR 116 line and SL 118 line meeting an erase voltage threshold causes programmable resistive element 126 to be set into an erase resistance state.

Figure 6:
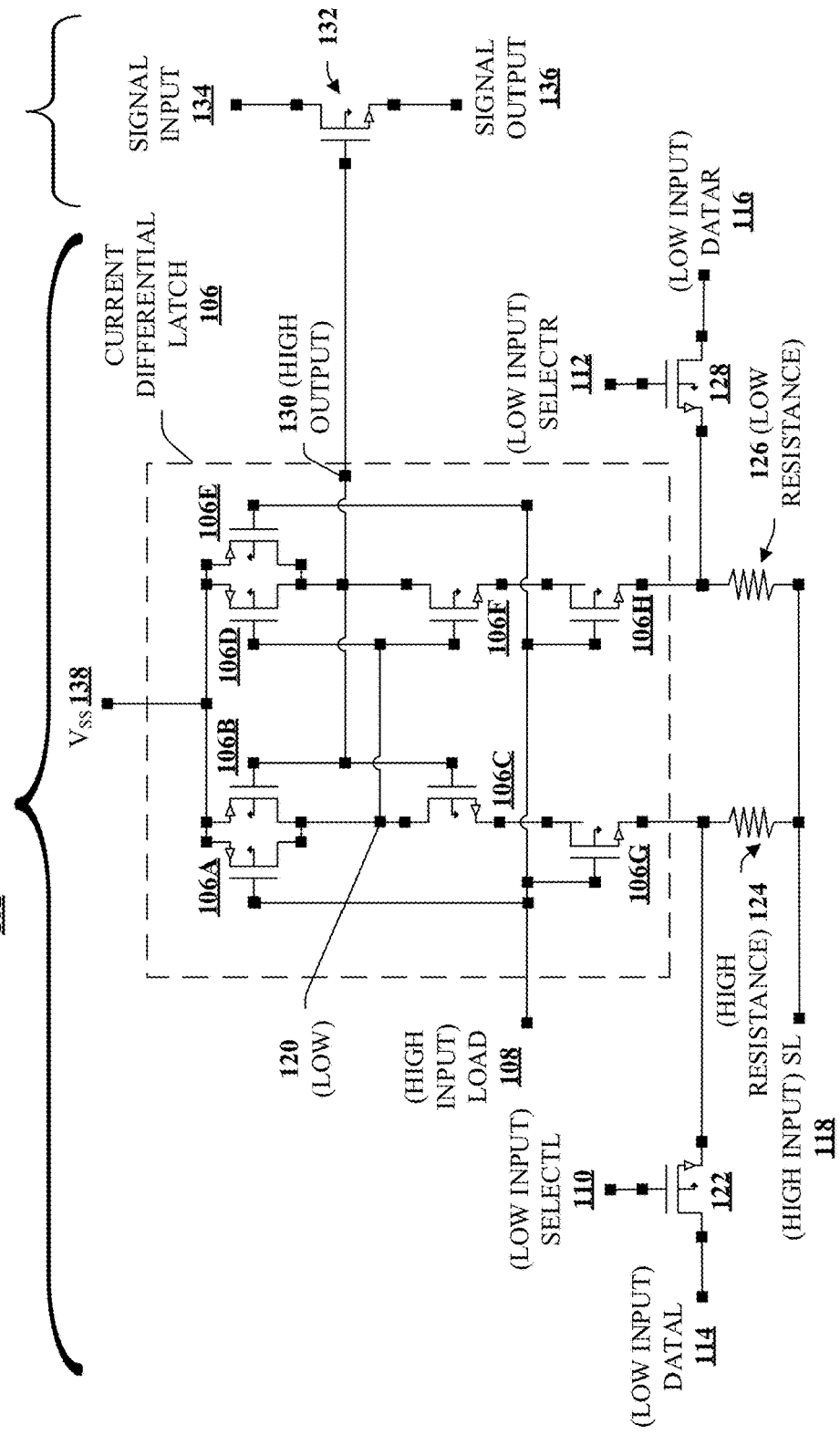
FIG. 6 illustrates a schematic diagram of an example latch high voltage output operation according to one or more aspects of the subject disclosure.

FIG. 6 illustrates a schematic diagram of an example latch high voltage output operation according to one or more aspects of the subject disclosure. In a non-limiting example, an operation of generating a high voltage at output 130 of current differential latch 106 is as follows. Programmable resistive element 124 is programmed to a high resistance state and programmable resistive element 126 is programmed to a low resistance state as described above. A high voltage input is applied to LOAD 108 input. This connects current differential latch 106 to programmable resistive elements 124 and 126 by activating transistor elements 106G and 106H. Concurrent to the high voltage input applied to LOAD 108 input, a low voltage input is applied on Vss 138, SELECTL 110, SELECTR 112, DATAL 114, and DATAR 116 lines, and a high voltage input is applied to SL 118 line. Application of the low voltage input on SELECTL 110 and SELECTR 112 lines, isolates DATAL 114 line from programmable resistive element 124 by deactivating transistor element 122, and isolates DATAR 116 line from the second terminal of programmable resistive element 126, by deactivating transistor element 128. However, given that DATAL 114, and DATAR 116 lines are isolated from programmable resistive elements 124 and 126, DATAL 114, and DATAR 116 lines can have a high voltage applied or float. The high voltage applied on SL 118 line causes node 120 of current differential latch 106 to have low voltage and output 130 of current differential latch 106 to have high voltage. The high voltage at output 130 is seen at the gate of transistor element 132, thus activating transistor element 132 and coupling signal input 134 to signal output 136. The high voltage input applied to LOAD 108 input must be maintained to continue the high voltage at output 130. If the high voltage is removed from LOAD 108 input, current differential latch 106 will get reset.

Figure 7:
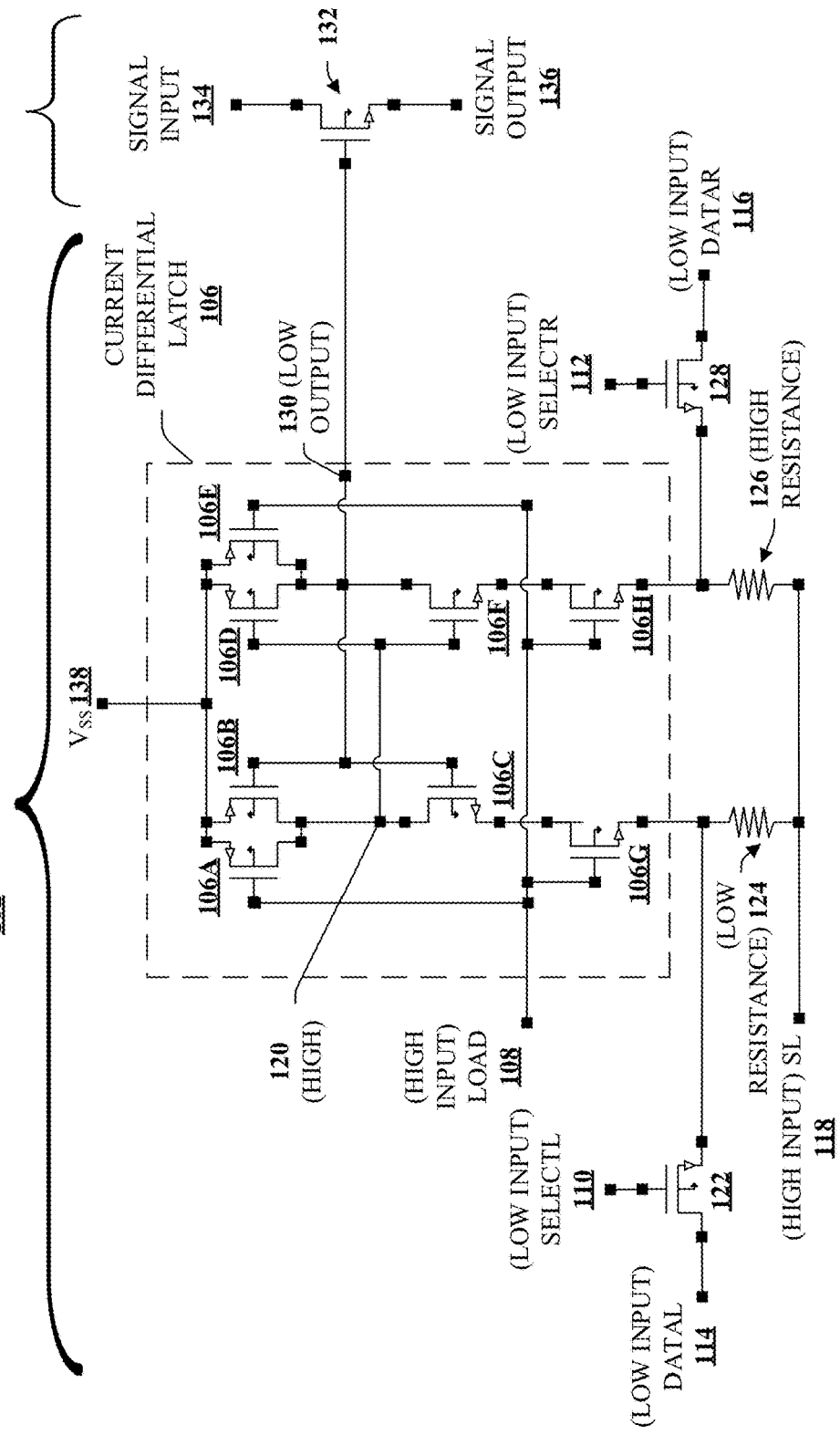
FIG. 7 illustrates a schematic diagram of an example latch low voltage output operation according to one or more aspects of the subject disclosure.

FIG. 7 illustrates a schematic diagram of an example latch low voltage output operation according to one or more aspects of the subject disclosure. In a non-limiting example, an operation of generating a low voltage at output 130 of current differential latch 106 is as follows. Programmable resistive element 124 is programmed to a low resistance state and programmable resistive element 126 is programmed to a high resistance state as described above. A high voltage input is applied to LOAD 108 input. This connects current differential latch 106 to programmable resistive elements 124 and 126 by activating transistor elements 106G and 106H. Concurrent to the high voltage input applied to LOAD 108 input, a low voltage input is applied on Vss 138, SELECTL 110, SELECTR 112, DATAL 114, and DATAR 116 lines, and a high voltage input is applied to SL 118 line. Application of the low voltage input on SELECTL 110 and SELECTR 112 lines, isolates DATAL 114 line from programmable resistive element 124 by deactivating transistor element 122, and isolates DATAR 116 line from the second terminal of programmable resistive element 126, by deactivating transistor element 128. However, given that DATAL 114, and DATAR 116 lines are isolated from programmable resistive elements 124 and 126, DATAL 114, and DATAR 116 lines can have a high voltage applied or float. The high voltage applied on SL 118 line causes node 120 of current differential latch 106 to have high voltage and output 130 of current differential latch 106 to have low voltage. The low voltage at output 130 is seen at the gate of transistor element 132, thus deactivating transistor element 132 and isolating signal input 134 from signal output 136. The high voltage input applied to LOAD 108 input must be maintained to continue the low voltage at output 130. If the high voltage is removed from LOAD 108 input, current differential latch 106 will get reset.

The above described resistive switching memory configuration cell 100 provides several advantages over existing configuration bit/cell technologies. For example, resistive switching memory configuration cell 100 does not require DC current. In another example, the resistive switching memory configuration cell 100 does not induce voltage stress across the programmable resistive elements. A further example advantage is that the resistive switching memory configuration cell 100 uses differential latch sensing. Another example advantage is that resistive switching memory configuration cell 100 provides reliable and fast settling during initialization (e.g., powerup) of the FPGA to a desired configuration state.

Figure 8:
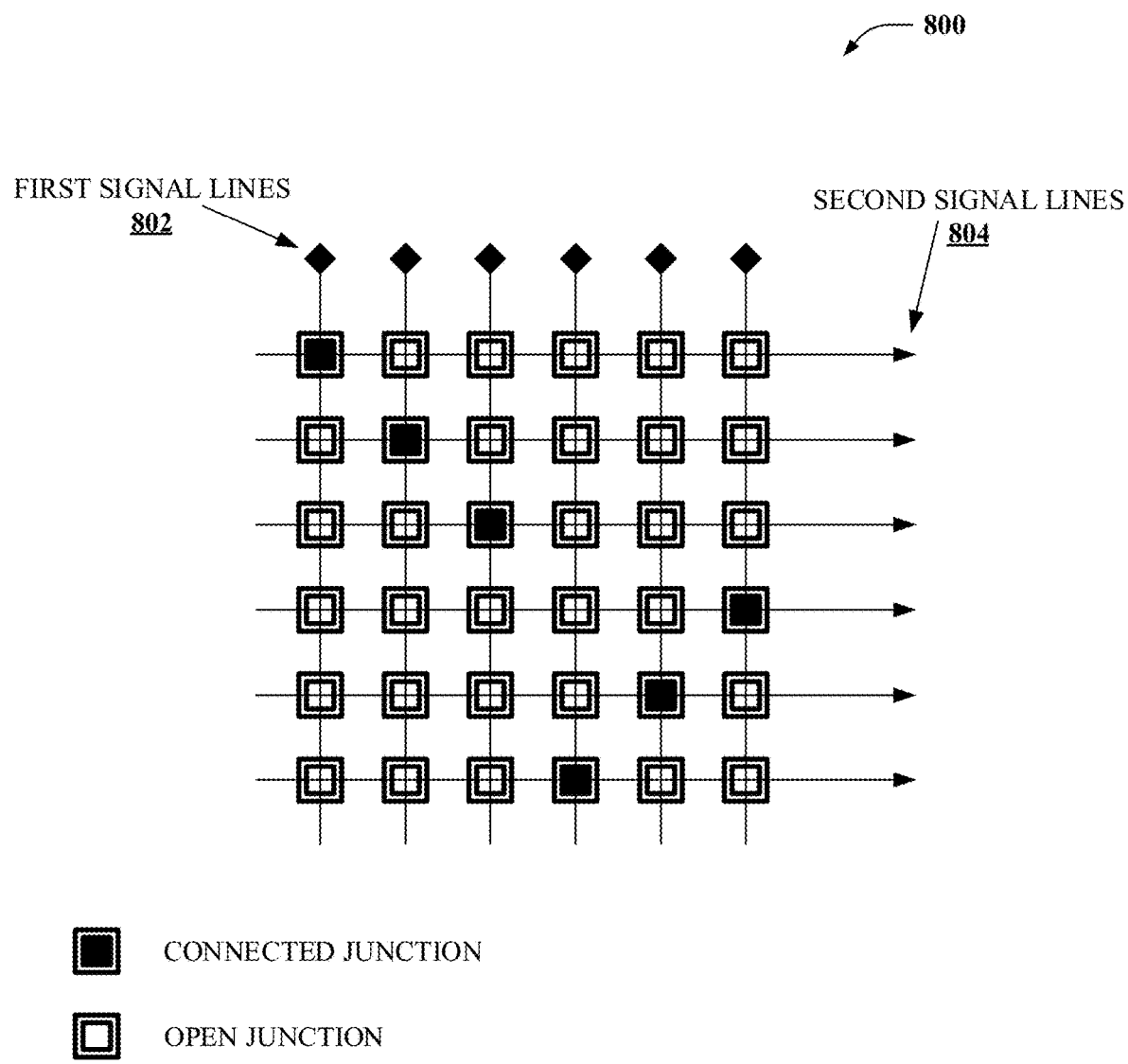
FIG. 8 illustrates a block diagram of an example programmable switching block according to one or more aspects of the subject disclosure.

FIG. 8 illustrates a block diagram of an example programmable switching block 800 according to further aspects of the subject disclosure. According to particular aspects, programmable switching block 800 can be programmed via resistive switching memory configuration cells. In at least one such aspect, the resistive switching memory configuration cells can be described substantially according to resistive switching memory configuration cell 100.

Programmable switching block 800 can comprise a set of first signal lines 802 (e.g. signal inputs or signal outputs) intersecting a set of second signal lines 804 (e.g. signal inputs or signal outputs). Moreover, a resistive switching memory configuration cell is formed at respective junctions of first signal lines 802 and second signal lines 804.

The resistive switching memory configuration cell is configured, in an activated or programmed state, to electrically connect a first signal line and a second signal line at a particular junction, and in a deactivated or erased state, to electrically isolate the first signal line and the second signal line. A connected junction is a programmed junction, depicted by a black square at the respective junction. An isolated junction is an open junction, depicted by a white square at the respective junction.

It should be appreciated that respective junctions of programmable switching block 800 can be reprogrammed (e.g., by changing activation/deactivation states of resistive switching memory configuration cells positioned at the respective junctions). Thus, although a particular program state is depicted by the connected junctions and open junctions of FIG. 8, the depicted example is only one possible program state for programmable switching block 800. Further, it should be understood that programmable switching block can be reprogrammed in the field, for FPGA applications.

In addition to the foregoing, in at least some aspects of the subject disclosure, programmable switching block 800 can have bidirectional first signal lines and second signal lines. Said differently, one (or more) of first signal lines 802 can initiate a signal, which can be received at a corresponding one (or more) of second signal lines 804, or one (or more) of second signal lines 804 can initiate a signal, which can be received at a corresponding one (or more) of first signal lines 802. As described herein, whether this signal is received or not received at the first signal line or second signal line is determined from a configuration state of an associated resistive switching memory configuration cell. If the associated resistive switching memory configuration cell is configured as a closed circuit, the signal can be received at the corresponding signal line; otherwise, the signal is not received. Therefore, although programmable switching block 800 identifies respective first signal lines 802 and second signal lines 804, it should be appreciated that in the above-described aspects, first signal lines 802 and second signal lines 804 can be renamed signal contacts 805 (not depicted) having a first end 805A and second end 805B, that can be employed for either transmitting or receiving a signal, or both, under suitable conditions (e.g., signals of different frequency, phase, or other suitable distinguishing characteristic could be transmitted concurrently at first end 805A and second end 805B, and received at the corresponding other end 805B and 805A, respectively).

The aforementioned diagrams have been described with respect to interaction between several components, or memory architectures. It should be appreciated that such diagrams can include those components and architectures specified therein, some of the specified components/architectures, and/or additional components/architectures. For example, a resistive switching memory configuration cell architecture could include a combination of programmable resistive elements 124 and 126, transistor elements 122 and 128, and current differential latch 106, in conjunction with transistor element 132, signal input 134 and signal output 136. Sub-components could also be implemented as electrically connected to other sub-components rather than included within a parent architecture. Additionally, it should be noted that one or more disclosed processes could be combined into a single process providing aggregate functionality. For instance, a program process can comprise an erase process, or vice versa, to facilitate programming and erasing a semiconductor cell by way of a single process. In addition, it should be appreciated that respective rows of disclosed switching blocks can be programmed or erased in groups (e.g., multiple rows programmed or erased concurrently) or individually. Components of the disclosed architectures can also interact with one or more other components not specifically described herein but known by those of skill in the art.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" "has" or "having" are used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Figure 9:
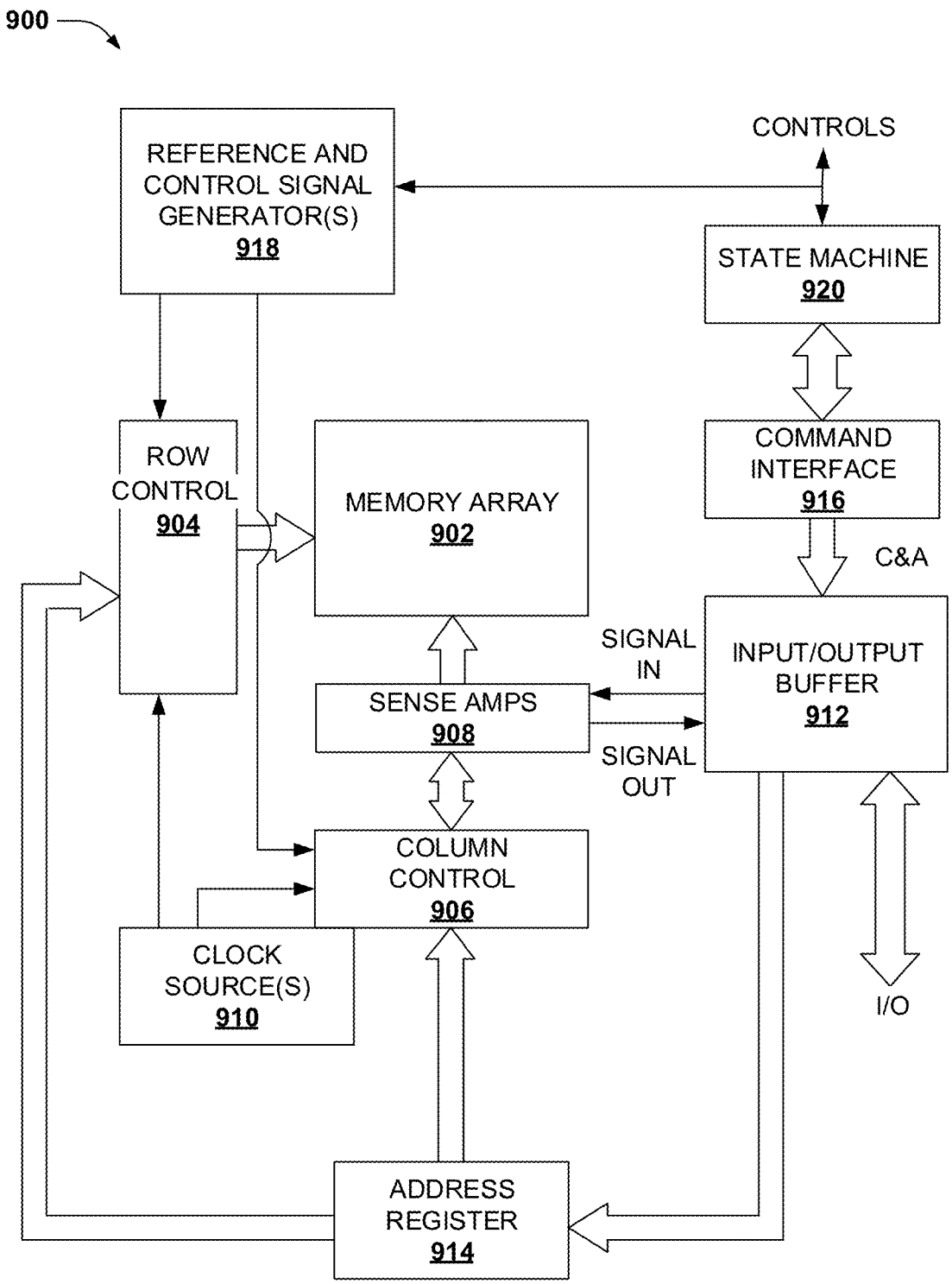
FIG. 9 depicts a block diagram of an example electronic operating environment according to one or more aspects of the subject disclosure.

In order to provide a context for the various aspects of the disclosed subject matter, FIG. 9, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject innovation also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules may be located in both local and remote memory storage modules or devices.

FIG. 9 illustrates a block diagram of an example operating and control environment 900 for a programmable switching block 902 according to aspects of the subject disclosure. In at least one aspect of the subject disclosure, programmable switching block 902 can comprise resistive switching memory cell technology. Respective resistive switching memory cells can be employed for programming respective input and output signal junctions of programmable switching block 902, as described herein.

A column controller 906 can be formed adjacent to programmable switching block 906. Moreover, column controller 906 can be electrically coupled with bit lines of programmable switching block 902. Column controller 906 can control respective bitlines, applying suitable program, erase or read voltages to selected bitlines.

In addition, operating and control environment 900 can comprise a row controller 904. Row controller 904 can be formed adjacent to programmable switching block 906, and electrically connected with word lines of programmable switching block 902. Row controller 904 can select particular rows of memory cells with a suitable selection voltage. Moreover, row controller 904 can facilitate program, erase or read operations by applying suitable voltages at selected word lines.

A clock source(s) 908 can provide respective clock pulses to facilitate timing for read, write, and program operations of row control 904 and column control 906. Clock source(s) 908 can further facilitate selection of word lines or bit lines in response to external or internal commands received by operating and control environment 900. An input/output buffer 912 can be connected to an external host apparatus, such as a computer or other processing device (not depicted) by way of an I/O buffer or other I/O communication interface. Input/output buffer 912 can be configured to receive write data, receive an erase instruction, output readout data, and receive address data and command data, as well as address data for respective instructions. Address data can be transferred to row controller 904 and column controller 906 by an address register 910. In addition, input data is transmitted to programmable switching block 902 via signal input lines, and output data is received from programmable switching block 902 via signal output lines. Input data can be received from the host apparatus, and output data can be delivered to the host apparatus via the I/O buffer.

Commands received from the host apparatus can be provided to a command interface 914. Command interface 914 can be configured to receive external control signals from the host apparatus, and determine whether data input to the input/output buffer 912 is write data, a command, or an address. Input commands can be transferred to a state machine 916.

State machine 916 can be configured to manage programming and reprogramming of programmable switching block 902. State machine 916 receives commands from the host apparatus via input/output interface 912 and command interface 914, and manages read, write, erase, data input, data output, and like functionality associated with programmable switching block 902. In some aspects, state machine 916 can send and receive acknowledgments and negative acknowledgments regarding successful receipt or execution of various commands.

To implement read, write, erase, input, output, etc., functionality, state machine 916 can control clock source(s) 908. Control of clock source(s) 908 can cause output pulses configured to facilitate row controller 904 and column controller 906 implementing the particular functionality. Output pulses can be transferred to selected bit lines by column controller 906, for instance, or word lines by row controller 904, for instance.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A field programmable gate array (FPGA), comprising:
   a switching block routing array comprising a plurality of signal inputs and a plurality of signal outputs;
   a first transistor element (132) coupled to the switching block routing array, wherein the first transistor element comprises a gate, a first terminal and a second terminal, wherein the first terminal of the first transistor element is coupled to a signal input from the plurality of signal inputs, and wherein the second terminal first transistor element is coupled to a signal output from the plurality of signal outputs, and wherein the gate first transistor element is configured to electrically couple or decouple the signal input and the signal output in response to an output signal from an output of a current differential latch (106);
   a first programmable resistive element (124) that comprises a first terminal and a second terminal;
   a second programmable resistive element (126) that comprises a first terminal and a second terminal, wherein the second terminals of the first and second programmable resistive elements are coupled to each other and the source line;
   a second transistor element (122) that comprises a gate, a first terminal and a second terminal;
   a third transistor element (128) that comprises a gate, a first terminal and a second terminal;
   the current differential latch comprising, a source input, a load input (108), a fourth transistor element (106A), a fifth transistor element (106B), a sixth transistor element (106D), a seventh transistor element (106E), an eighth transistor element (106C), a ninth transistor element (106F), a tenth transistor element (106G), and an eleventh transistor element (106H), and an output (130), wherein the output is coupled to the first gate of the first transistor element, and the fourth transistor element, the fifth transistor element, the sixth transistor element, the seventh transistor element, the eighth transistor element, the ninth transistor element, the tenth transistor element, and the eleventh transistor element each have a gate, a first terminal and a second terminal;
   wherein the gate of the second transistor element is coupled to a first select line (110), the second terminal of the second transistor element is coupled to a first data line (114), and the first terminal of the second transistor element is coupled to the first terminal of the first programmable resistive element and the second terminal of the tenth transistor element;
wherein the gate of the third transistor element is coupled to a second select line (112), the second terminal of the third transistor element is coupled to a second data line (116), and the first terminal of the third transistor element is coupled to the first terminal of the second programmable resistive element and the second terminal of the eleventh transistor element.

2. The field programmable gate array (FPGA) of claim 1:
wherein the gates of the fourth transistor element, the seventh transistor element, the tenth transistor element, and the eleventh transistor element are coupled to the load input;
wherein the first terminals of the fourth, fifth, sixth, and seventh transistor elements are coupled to each other and the source input;
wherein the second terminals of the fourth and fifth transistor elements, a first terminal of the eighth transistor element, and the gates of the sixth and ninth transistor elements are coupled to each other;
wherein the second terminals the sixth and seventh transistor elements, the first terminal of the ninth transistor element, and the gates of the fifth and eighth transistor elements are coupled to each other and the output;
wherein the first terminal of the tenth transistor element and the second terminal of the eighth transistor element are coupled to each other;
wherein the first terminal of the eleventh transistor element and the second terminal of the ninth transistor element are coupled to each other.

3. The field programmable gate array (FPGA) of claim 1:
wherein the fourth, fifth, sixth, seventh, eighth, and ninth transistor elements are PMOS transistors, and the tenth and eleventh transistor elements are NMOS transistors.

4. The field programmable gate array (FPGA) of claim 3, further comprising:
a command component configured to program the first programmable resistive element to a low resistance state, comprising:
concurrently apply:
a low voltage input to the load input, the second select line, the second data line, and the source line, and
a high voltage input to the first select line and the first data line.

5. The field programmable gate array (FPGA) of claim 3, further comprising:
a command component configured to program the first programmable resistive element to a high resistance state, comprising:
concurrently apply:
a low voltage input to the load input, the second select line, the second data line, and the first data line, and
a high voltage input to the first select line and the source line.

6. The field programmable gate array (FPGA) of claim 3, further comprising:
a command component configured to program the second programmable resistive element to a low resistance state, comprising:
concurrently apply:
a low voltage input to the load input, the first select line, the first data line, and the source line, and
a high voltage input to the second select line and the second data line.

7. The field programmable gate array (FPGA) of claim 3, further comprising:
a command component configured to program the second programmable resistive element to a high resistance state, comprising:
concurrently apply:
a low voltage input to the load input, the first select line, the first data line, and the second data line, and
a high voltage input to the second select line and the source line.

8. The field programmable gate array (FPGA) of claim 3, further comprising:
a command component configured to generate the output signal having a high voltage, comprising:
with the first programmable resistive element in a high resistance state and the second programmable resistive element in a low resistance state concurrently apply:
a low voltage input to the source input, the first select line, the second select line, the first data line, and the second data line, and
a high voltage input to the load input and the source line.

9. The field programmable gate array (FPGA) of claim 3, further comprising:
a command component configured to generate the output signal having a low voltage, comprising:
with the first programmable resistive element in a low resistance state and the second programmable resistive element in a high resistance state concurrently apply:
a low voltage input to the source input, the first select line, the second select line, the first data line, and the second data line, and
a high voltage input to the load input and the source line.

10. A configuration bit for a field programmable gate array (FPGA), comprising:
a first transistor element coupled to a signal input and a signal output of the FPGA, and configured to electrically connect the signal input with the signal output or electrically isolate the signal input from the signal output in response to a gate voltage applied at a gate of the first transistor element;
a latch comprising an output node that provides the gate voltage to the gate of the first transistor element and comprising a differential node, wherein the latch is configured such that a high voltage supplied to the differential node causes the output node to have a low voltage and the differential node to have the high voltage, and wherein the high voltage supplied to the output node causes the differential node to have the low voltage and the output node to have the high voltage;
a first programmable resistive element having a first terminal selectively connected to the differential node of the latch;
a second programmable resistive element having a second terminal selectively connected to the output node of the latch; and
a source line connected to a second terminal of the first programmable resistive element and to a second terminal of the second programmable resistive element, wherein in response to a high voltage at the source line and the first programmable resistive element being selectively connected to the differential node of the latch and the second programmable resistive element being selectively connected to the output node of the latch, one of:

the high voltage is supplied by the first programmable resistive element to the differential node of the latch in response to the first programmable resistive element having a low resistance state; or the high voltage is supplied by the second programmable resistive element to the output node of the latch in response to the second programmable resistive element having the low resistance state.

* * * * *